(12) United States Patent
Murakami et al.

(10) Patent No.: US 10,251,269 B2
(45) Date of Patent: Apr. 2, 2019

(54) WIRING BOARD, ELECTRONIC DEVICE, AND LIGHT EMITTING APPARATUS

(71) Applicant: KYOCERA Corporation, Kyoto-shi, Kyoto (JP)

(72) Inventors: Kensaku Murakami, Kyoto (JP); Yurie Onitsuka, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 45 days.

(21) Appl. No.: 14/412,195

(22) PCT Filed: Dec. 27, 2013

(86) PCT No.: PCT/JP2013/085121
§ 371 (c)(1),
(2) Date: Dec. 30, 2014

(87) PCT Pub. No.: WO2014/104300
PCT Pub. Date: Jul. 3, 2014

(65) Prior Publication Data
US 2015/0173190 A1 Jun. 18, 2015

(30) Foreign Application Priority Data

Dec. 27, 2012 (JP) .................................. 2012-285342

(51) Int. Cl.
*F21V 21/00* (2006.01)
*H05K 1/11* (2006.01)
(Continued)

(52) U.S. Cl.
CPC .............. *H05K 1/115* (2013.01); *F21V 21/00* (2013.01); *H01L 33/62* (2013.01); *H05K 1/0306* (2013.01);
(Continued)

(58) Field of Classification Search
CPC ......... F21S 4/001; F21S 4/003; F21V 19/008; F21V 23/06; F21V 19/0005;
(Continued)

(56) References Cited

U.S. PATENT DOCUMENTS 6,525,623 B2 2/2003 Sridharan et al.
7,102,085 B2 * 9/2006 Ohta ................. H01L 23/49833
174/260

(Continued)

FOREIGN PATENT DOCUMENTS

JP 10-275979 A 10/1998
JP 2001-15881 A 1/2001
(Continued)

OTHER PUBLICATIONS

Office Action dated Aug. 25, 2015, issued in counterpart Japanese Application No. 2014-554594.
International search report dated Feb. 4, 2014 issued in counterpart International application No. PCT/JP2013/085121.

*Primary Examiner* — Robert J May
(74) *Attorney, Agent, or Firm* — Procopio Cory Hargreaves and Savitch LLP

(57) ABSTRACT

A wiring board includes a ceramic insulating base; a recessed portion provided on a side surface of the insulating base, the recessed portion being connected to one main surface of the insulating base; an internal wiring conductor disposed in an interior of the insulating base; an external wiring conductor disposed on one main surface of the insulating base; a recessed portion wiring conductor disposed in the recessed portion, the recessed portion wiring conductor being connected to the internal wiring conductor and the external wiring conductor; and a through conductor disposed in an interior of the insulating base, the through conductor electrically connecting the internal wiring conductor and the external wiring conductor. In a see-through (Continued)

plan view of the insulating base from a one main surface side, the recessed portion extends in one direction, and the through conductor is disposed in a periphery of an end portion of the recessed portion.

7 Claims, 8 Drawing Sheets

(51) Int. Cl.
*H05K 1/03* (2006.01)
*H01L 33/62* (2010.01)
*H01L 33/48* (2010.01)

(52) U.S. Cl.
CPC .. *H01L 33/486* (2013.01); *H01L 2224/16225* (2013.01); *H01L 2224/48091* (2013.01); *H01L 2924/15174* (2013.01); *H01L 2924/181* (2013.01)

(58) Field of Classification Search
CPC . F21V 21/002; F21V 29/004; F21W 2121/00; F21Y 2101/02; F21Y 2115/10; F21K 9/00; H01L 33/486; F05K 1/0306; H05K 1/115
USPC ............ 362/382, 391, 249.01, 249.02
See application file for complete search history.

(56) References Cited

U.S. PATENT DOCUMENTS

| | | | | |
|---|---|---|---|---|
| 7,208,832 B2* | 4/2007 | Yamagata | ......... | H01L 23/49816 257/701 |
| 7,737,365 B2* | 6/2010 | Ishii | ....................... | G11B 5/486 174/250 |
| 8,125,788 B2* | 2/2012 | Hatanaka | ............. | H03H 9/1021 257/659 |
| 8,482,137 B2* | 7/2013 | Yoshioka | ................. | H01L 24/24 257/618 |
| 8,929,092 B2* | 1/2015 | Yoshioka | .......... | H01L 23/49811 174/250 |
| 9,022,633 B2* | 5/2015 | Ito | ........................ | G02B 6/0031 362/249.02 |
| 9,147,666 B2* | 9/2015 | Yoshihara | ............. | H01L 23/645 |
| 2004/0233024 A1 | 11/2004 | Almeida et al. | | |
| 2009/0218123 A1 | 9/2009 | Yamamoto et al. | | |
| 2010/0147568 A1 | 6/2010 | Nomiya | | |

FOREIGN PATENT DOCUMENTS

| | | |
|---|---|---|
| JP | 2007-67246 A | 3/2007 |
| JP | 2011-222945 A | 11/2011 |
| WO | 2008/075521 A1 | 6/2008 |
| WO | 2009/028289 A1 | 3/2009 |

* cited by examiner (a)

(b)

(a)

(b)

(a)

(b)

(a)

(b)

(a)

(b)

WIRING BOARD, ELECTRONIC DEVICE, AND LIGHT EMITTING APPARATUS

TECHNICAL FIELD

The present invention relates to a wiring board for mounting an electronic part, an electronic device, and a light emitting apparatus.

BACKGROUND ART

Conventionally, wiring boards for mounting an electronic part are constituted by an insulating base formed of an electrically insulating material, and a wiring conductor provided in the insulating base.

Examples of this kind of wiring board include a wiring board comprising an insulating base having a side surface including a recessed portion, wiring conductors provided on an upper surface of the insulating base, a lower surface of the insulating base, and in the recessed portion, and through conductors connected to the wiring conductor provided on the upper surface and the wiring conductor provided on the lower surface, the through conductors being provided in the insulating base (e.g., see Patent Literature 1).

CITATION LIST

Patent Literature

Patent Literature 1: Japanese Unexamined Patent Publication JP-A 2007-67246

SUMMARY OF INVENTION

Technical Problem

In recent years, electronic devices have been decreasing in size, but in order to suppress a decrease in the strength of bonding the wiring board to an external circuit substrate through a brazing material, there has been demand to increase the length in the side direction (width) of the substrate with respect to the depth of the recessed portion in the wiring board, for example.

However, in the case where the insulating base constituting the wiring board is formed of ceramics, there are cases where the central portion of the recessed portion deforms so as to project toward the interior of the recessed portion in a plan view if a ceramic green sheet stacked body is formed and pressure is applied thereto, for example, at the time of manufacturing the wiring board, whereupon the through conductors and the wiring conductors are disconnected or have abnormal resistance. In the case where the electronic part is a light emitting apparatus, there is a possibility that light will not be emitted normally.

Solution to Problem

According to one aspect of the invention, a wiring board includes: an insulating base formed of ceramics; a recessed portion provided on a side surface of the insulating base, the recessed portion being connected to one main surface of the insulating base; an internal wiring conductor disposed in an interior of the insulating base; an external wiring conductor disposed on one main surface of the insulating base; a recessed portion wiring conductor disposed in the recessed portion, the recessed portion wiring conductor being connected to the internal wiring conductor and the external wiring conductor; and a through conductor disposed in the interior of the insulating base, the through conductor electrically connecting the internal wiring conductor and the external wiring conductor, in a see-through plan view of the insulating base from a one main surface side, the recessed portion extending in one direction, the through conductor being disposed in a periphery of an end portion of the recessed portion.

According to one aspect of the invention, an electronic device includes: a wiring board with the above-described configuration; and an electronic part mounted on the wiring board.

According to one aspect of the invention, a light emitting apparatus includes a light emitting element as an electronic part with the above-described configuration.

Advantageous Effects of Invention

With the wiring board according to one aspect of the invention, even if the recessed portion of the insulating base deforms at the time of manufacturing the wiring board, the through conductor is disposed in the periphery of the end portion of the recessed portion and is less prone to be disconnected.

With the electronic device and light emitting apparatus according to one aspect of the invention, it is possible to improve the reliability of electrical connection between an external circuit board and the electronic part or the light emitting element.

DESCRIPTION OF EMBODIMENTS

Some exemplary embodiments of the invention will be described hereinafter with reference to the accompanying drawings.

First Embodiment

Figure 1:
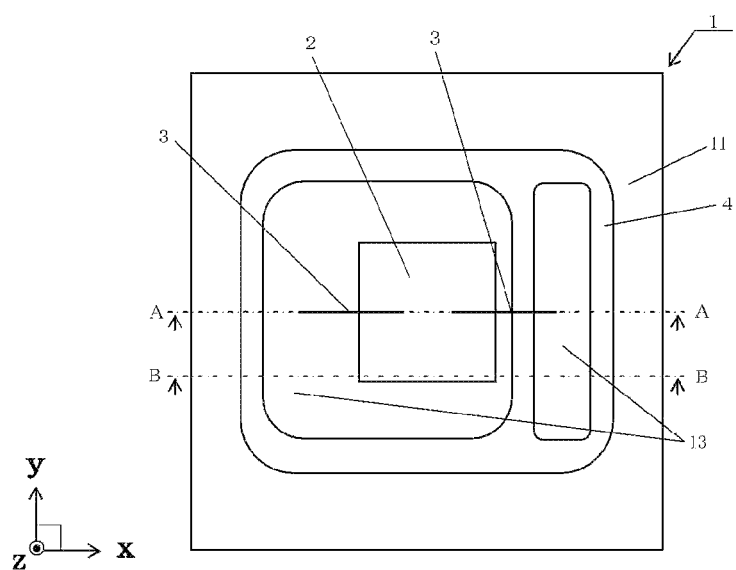
FIG. 1(a) is a top view showing a wiring board according to a first embodiment of the invention.
FIG. 1(b) is a see-through bottom view of FIG. 1(a)
Figure 1:
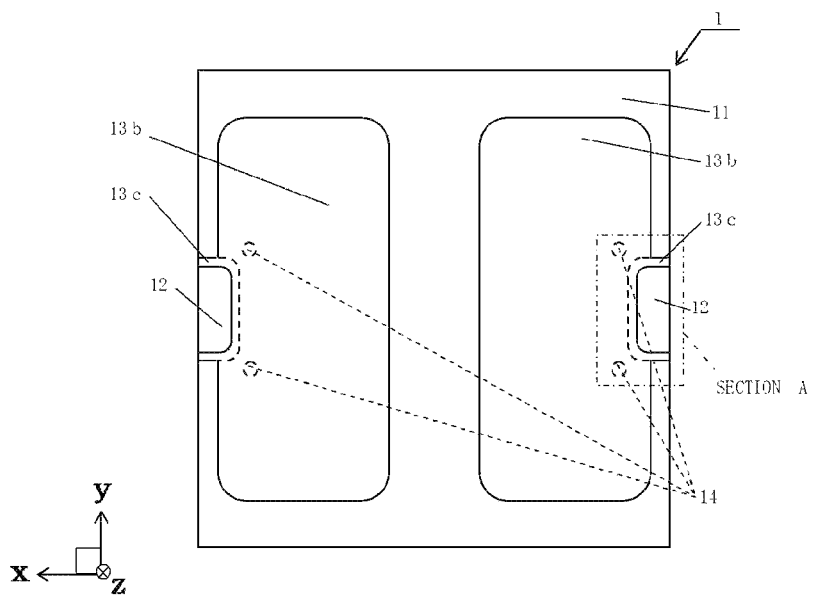
Figure 2:
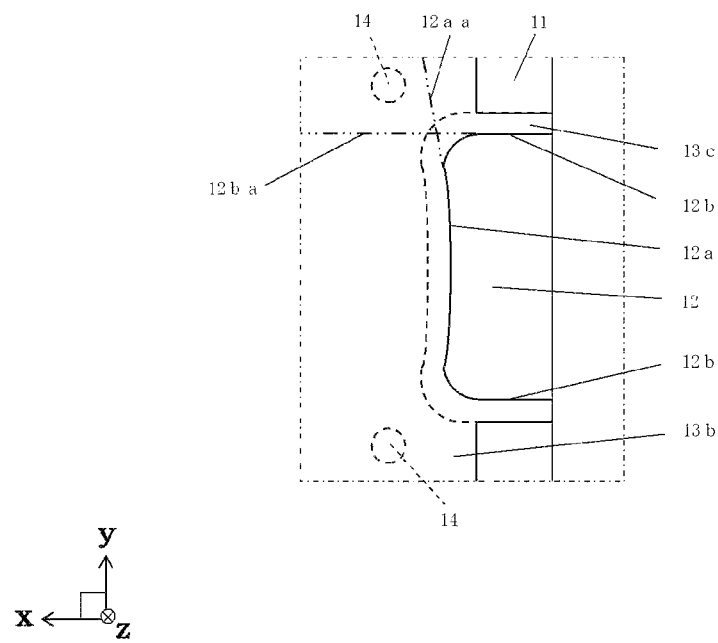
FIG. 2 is an enlarged see-through bottom view showing relevant parts of Section A in FIG. 1(b)
Figure 3:
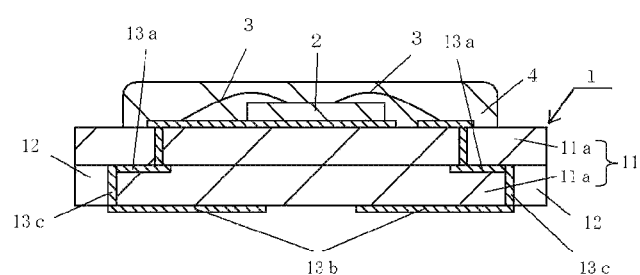
FIG. 3(a) is a cross-sectional view taken along the line A-A in FIG. 1(a)
FIG. 3(b) is a see-through cross-sectional view taken along the line B-B in FIG. 1(a)
Figure 3:
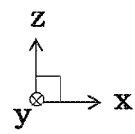
Figure 3:
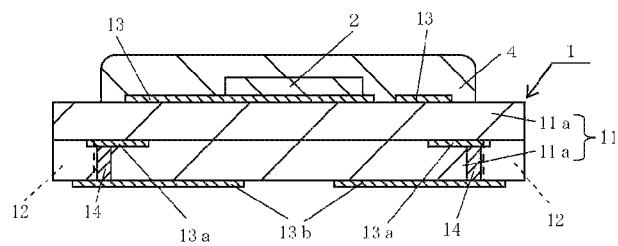
Figure 3:
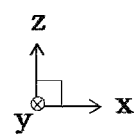

As in the examples shown in FIGS. 1 to 3, an electronic device according to a first embodiment of the invention includes a wiring board 1 and an electronic part 2 disposed on an upper surface of the wiring board 1. The electronic device is mounted on a circuit board constituting an electronic part module, for example.

The wiring board 1 has an insulating base 11; a recessed portion 12 provided on a side surface of the insulating base 11, the recessed portion 12 being connected to one main surface of the insulating base 11; an internal wiring conductor 13a disposed in an interior of the insulating base 11; an external wiring conductor 13b disposed on one main surface of the insulating base 11; a recessed portion wiring conductor 13c disposed in the recessed portion 12, the recessed portion wiring conductor 13c being connected to the internal wiring conductor 13a and the external wiring conductor 13b; and a through conductor 14 disposed in the interior of the insulating base 11, the through conductor 14 electrically connecting the internal wiring conductor 13a and the external wiring conductor 13b. Note that in FIGS. 1 to 9, the electronic device is mounted in an xy plane in a virtual xyz space. In FIG. 3, an "upward direction" means a positive direction on a virtual z axis.

The insulating base 11 is composed of a plurality of insulating layers 11a, has an upper surface including a mounting region for an electronic part 2, and has a rectangular plate shape in a plan view. The insulating base 11 functions as a support member for supporting the electronic part 2, and the electronic part 2 is adhered and fixed to a mounting region in an upper-surface central portion of the insulating base 11 via a bonding agent such as a low-melting-point brazing material or a conductive resin. Examples of a usable material for the insulating base 11 include ceramics.

The insulating base 11 can be formed using ceramics, and for example, an aluminum oxide sintered body (alumina ceramics), an aluminum nitride sintered body, a mullite sintered body, a glass ceramic sintered body, or the like can be used.

In a case where the insulating base 11 is formed of, for example, an aluminum oxide sintered body, the insulating base 11 is produced as follows. A slurry is prepared by admixing a suitable organic binder, solvent, and so on to a raw material powder such as aluminum oxide, silicon oxide, magnesium oxide, and calcium oxide. The slurry is formed into a sheet shape using a doctor blade method, a calender roll method, or otherwise so as to obtain a ceramic green sheet. Thereafter, a plurality of ceramic green sheets are suitably punched, laminated, and fired at a high temperature (around 1600° C.) to produce the insulating base 11.

The recessed portion 12 is disposed on the side surface of the insulating base 11 and is connected to the lower surface of the insulating base 11. As in the example shown in FIG. 3, the recessed portion 12 may be disposed over a region from a portion of the side surface to the lower surface of the insulating base 11, and it may be disposed over a region from the upper surface to the lower surface of the insulating base 11. Also, the recessed portion 12 extends in a direction along an outer edge of the insulating base 11, for example. Note that the recessed portion 12 may be rectangular in a plan view. Here, "rectangular" can mean that corner portions of the recessed portion 12 are formed in a circular shape in a plan view, as in the examples shown in FIGS. 1 and 2. The recessed portion 12 is formed by using laser machining or punching by means of a die to form through holes which are to be the recessed portion 12 on several ceramic green sheets for the insulating base 11.

A wiring conductor 13 is disposed on the surface and inside the insulating base 11 and on the inner surface of the recessed portion 12, and has the internal wiring conductor 13a, the external wiring conductor 13b, and the recessed portion wiring conductor 13c. The internal wiring conductor 13a is disposed inside the insulating base 11. The external wiring conductor 13b is disposed on the lower surface of the insulating base 11. The recessed portion wiring conductor 13c is disposed in the recessed portion 12 and is connected to the internal wiring conductor 13a and the external wiring conductor 13b. The wiring conductor 13 is configured to electrically connect the electronic part 2 mounted on the wiring board 1, and an external circuit board. The wiring conductor 13 disposed on the surface and inside the insulating base 11 includes a wiring conductor layer disposed on the surface and inside the insulating base 11, and a through wiring conductor which electrically connects both the wiring conductor layers arranged above and below through an insulating layer 11a included in the insulating base 11.

In the periphery of the recessed portion 12, a through conductor 14 connects the internal wiring conductor 13a and the external wiring conductor 13b of the wiring conductor 13. The through conductor 14 serves a role of electrically connecting the internal wiring conductor 13a and the external wiring conductor 13b of the wiring conductor 13 even if the recessed portion wiring conductor 13c of the wiring conductor 13 is disconnected or increases in resistance.

As in the examples shown in FIGS. 1 and 2, in a see-through plan view from, for example, the lower surface side of the insulating base 11, the recessed portion 12 extends in a direction along the outer edge of the insulating base 11, for example, and the through conductor 14 is disposed in the periphery of the end portion of the recessed portion 12. With such a configuration, the through conductor 14 is disposed in a portion with little deformation, or in other words, in the periphery of the end portion of the recessed portion 12 in a see-through plan view from the lower surface side, for example, and thus, even if the central portion of the recessed portion 12 deforms in the ceramic green sheet stacked body so as to project toward the inner side direction of the recessed portion 12 in a plan view from the lower surface side at the time of manufacturing the wiring board 1, for example, the through conductor 14 can be made less prone to be disconnected from the internal wiring conductor 13a or the external wiring conductor 13b.

Also, as in the examples shown in FIGS. 1 and 2, it is preferable that the through conductor 14 is disposed in the periphery of both end portions of the recessed portion 12 when the insulating base 11 is viewed in a see-through plan view from the lower surface side, for example. Even if the wiring conductor 13 disposed on the inner surface of the recessed portion 12 becomes disconnected or increases in resistance, it is possible to reduce cases in which the electrical resistance between the wiring conductor 13 disposed on the upper surface of the insulating layer 11a and the wiring conductor 13 disposed on the lower surface of the insulating layer 11a increases. Also, since the through conductor 14 is disposed so as not to be unevenly distributed on either side of the recessed portion 12, it is possible to suppress deformation caused by differences in thermal expansion between the insulating layer 11a and the through conductor 14 at the time of manufacturing the wiring board 1.

Also, a configuration is used in which, in a plan view of the insulating base 11 from, for example, the lower surface side, the recessed portion 12 includes a first internal wall surface 12a disposed along the outer edge of the insulating base 11 for example, a second internal wall surface 12b extending in a different direction than the first internal wall surface 12a, and a corner portion at which the first internal wall surface 12a and the second internal wall surface 12b intersect, and the through conductor 14 is disposed in a region partitioned by a first extension line 12aa obtained by extending the first internal wall surface 12a, and by a second extension line 12ba obtained by extending the second internal wall surface 12b. When this configuration is used, the through conductor 14 is disposed in a portion of the insulating base 11 with a particularly high strength. Therefore, at the time of manufacturing the wiring board 1, even if the central portion of the recessed portion 12 deforms so as to project toward the inner side of the recessed portion 12 in a plan view in the ceramic green sheet stacked body, the through conductor 14 is disposed in a portion with less deformation, or in other words, in the region partitioned by the first extension line 12aa and the second extension line 12ba, and thus it is possible to effectively suppress disconnection of the through conductor 14 from the internal wiring conductor 13a or the external wiring conductor 13b.

Also, when the total electrical resistance of the plural through conductors 14 is smaller than the electrical resistance of the wiring conductor 13 provided in the recessed portion 12, in a case where the recessed portion wiring conductor 13c becomes disconnected or increases in resistance, the current will flow in the plural through conductors 14, and thus it is possible to suppress deformation of the wiring board 1 caused by heating when the current is applied to the recessed portion wiring conductor 13c.

Figure 4:
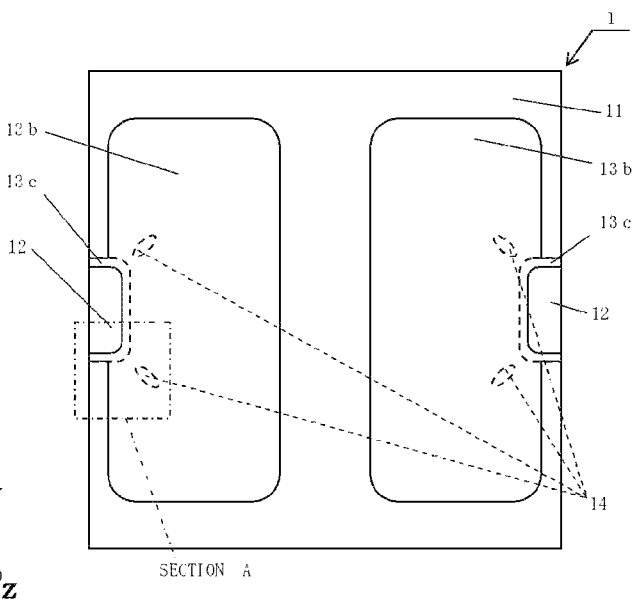
FIG. 4(a) is a see-through bottom view showing another example of the wiring board according to the first embodiment of the invention.
FIG. 4(b) is an enlarged see-through bottom view showing relevant portions of Section A in FIG. 4(a)
Figure 4:
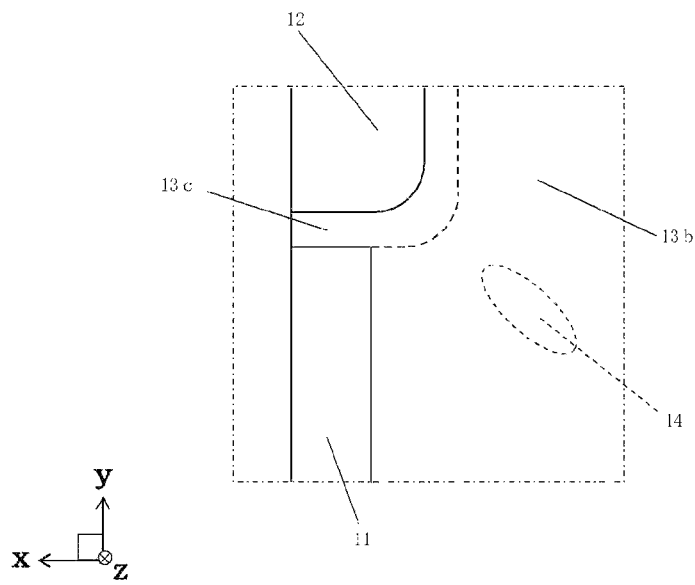
Figure 5:
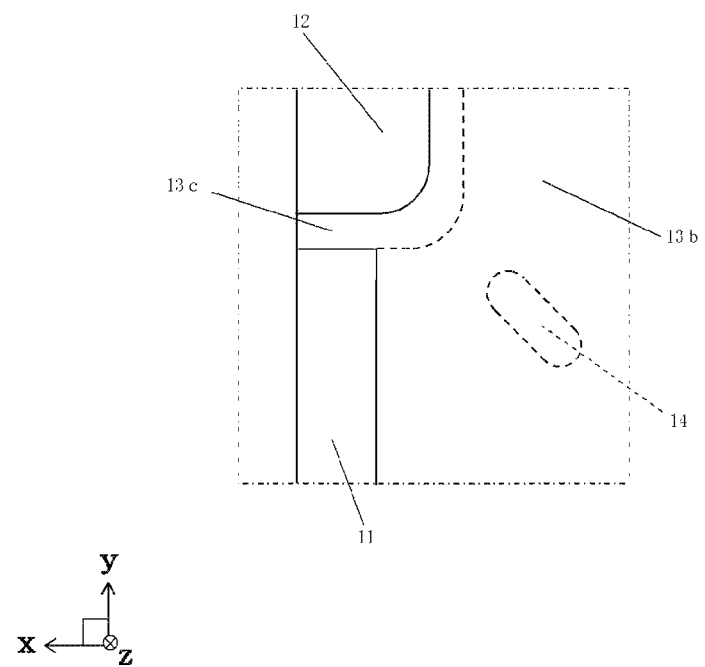
FIG. 5 is a see-through bottom view showing relevant portions of another example of the wiring board according to the first embodiment of the invention.

Also, as in the examples shown in FIGS. 4 and 5, if the through conductors 14 have a shape extending toward the corner portion in a see-through plan view, even if the ceramic green sheet stacked body deforms toward on the recessed portion 12 side in the periphery of both ends of the first internal wall surface 12a in plan view from the lower surface side, for example, at the time of manufacturing the wiring board 1, the through conductor 14 will have a shape longer in the deformation direction of the ceramic green sheet stacked body. Therefore, it is possible to make a connection portion between the through conductor 14 and the internal wiring conductor 13a or the external wiring conductor 13b less prone to become disconnected. In this case, the shape of the through conductor 14 may be elliptical in a see-through plan view, as in the example shown in FIG. 4, and it may be oval in a see-through plan view, as in the example shown in FIG. 5.

A metallic material such as tungsten (W), molybdenum (Mo), manganese (Mn), silver (Ag), or copper (Cu) can be used for the wiring conductor 13 and the through conductor 14. For example, in a case where the insulating base 11 is formed of an aluminum oxide sintered body, a conducting paste obtained by admixing a suitable organic binder, solvent, and so on to a high-melting-point metallic powder such as W, Mo, or Mn is print-applied in a predetermined pattern using screen printing on a ceramic green sheet which is to be the insulating base 11 in advance, and is fired at the same time as the ceramic green sheet which is to be the insulating base 11. Thereby, the wiring conductor is deposited and formed at a predetermined position on the insulating base 11. The wiring conductor 13 in a case of a through wiring conductor and the through conductor 14 are formed by forming a through hole in a green sheet by punching using a die and by means of laser machining, and filling the through hole with conducting paste for the wiring conductor 13 using a printing method. The recessed portion wiring conductor 13c is formed by print-applying the conducting paste for the wiring conductor 13 to the region which is to be the inner surface of the through hole which is to be the recessed portion 12.

A plating layer is deposited on an exposed surface of the wiring conductor 13 using an electrolytic plating method. The plating layer is formed of a metal having superior corrosion resistance and connectivity with a connecting member, such as nickel, copper, gold, or silver. For example, a nickel plating layer having a thickness of around 0.5 to 5 μm and a gold plating layer having a thickness of around 0.1 to 3 μm, or, a nickel plating layer having a thickness of around 1 to 10 μm and a silver plating layer having a thickness of around 0.1 to 1 μm are deposited in sequence. Accordingly, corrosion of the wiring conductor 13 can be effectively suppressed, and the fixation between the wiring conductor 13 and the electronic part 2, the bonding between the wiring conductor 13 and a connecting member 3 such as a bonding wire, and the bonding between the wiring conductor 13 and wiring for an external circuit board can be made strong. Also, with the wiring conductor 13 on which the electronic part 2 is mounted, heat from the electronic part 2 may be made prone to dissipate favorably by depositing a copper plating layer having a thickness of around 10 to 80 μm on a nickel plating layer.

An electronic device can be produced by mounting the electronic part 2 on the upper surface of the wiring board 1. The electronic part 2 to be mounted on the wiring board 1 is a semiconductor element such as an IC chip or an LSI chip, a light emitting element, a piezoelectric element such as a crystal oscillator or a piezoelectric oscillator, various types of sensors, and the like. For example, in a case where the electronic part 2 is a flip-chip semiconductor element, the semiconductor element is mounted on the wiring board 1 by electrically mechanically connecting the electrode of the semiconductor element and the wiring conductor 13 via the connecting member 3 such as a solder bump, a gold bump, or a conductive resin (anisotropic conductive resin, etc.). Also, for example, in a case where the electronic part 2 is a wire-bonding semiconductor element, the semiconductor element is fixed to the electronic part 2 mounting region using a bonding material, and is mounted thereafter on the wiring board 1 by electrically connecting the electrode of the semiconductor element and the wiring conductor 13 via the connecting member 3 such as a bonding wire. Also, a plurality of electronic parts 2 may be mounted on the wiring board 1, and small-sized electronic parts such as resistor elements and capacitor elements may be mounted on the wiring substrate 1 as necessary. Also, the electronic part 2 is sealed as necessary by a sealing member 4 formed of resin, glass, or the like, a lid body formed of resin, glass, ceramics, metal, or the like.

The wiring board 1 of the embodiment has an insulating base 11 formed of ceramics; a recessed portion 12 provided on the side surface of the insulating base 11, the recessed portion 12 being connected to one main surface of the insulating base 11; an internal wiring conductor 13a disposed in the interior of the insulating base 11; an external wiring conductor 13b disposed on one main surface of the insulating base 11; a recessed portion wiring conductor 13c which is disposed in the recessed portion 12 and connects the internal wiring conductor 13a and the external wiring conductor 13b; and a through conductor 14 which is disposed in the interior of the insulating base 11 and electrically connects the internal wiring conductor 13a and the external wiring conductor 13b, and the recessed portion 12 extends in one direction in a see-through plan view of the insulating base 11 from one main surface side, and the through conductor 14 is disposed in the periphery of the end portion of the recessed portion 12. With such a configuration, the through conductor 14 is disposed at a portion with little deformation, or in other words, in the periphery of the end portion of the recessed portion 12 in a see-through plan view from one main surface side, and therefore it is possible to make the through conductor 14 less prone to be disconnected from the internal wiring conductor 13a or the external wiring conductor 13b even if the central portion of the recessed portion 12 deforms so as to project toward the inner side of the recessed portion 12 in a plan view from one main surface in the ceramic green sheet stacked body at the time of manufacturing the wiring board 1. Accordingly, the through conductor 14 is not disconnected from the internal wiring conductor 13a or the external wiring conductor 13b, or a resistance abnormality does not occur, and emission of light is performed favorably in the case where the electronic part 2 is a light emitting element.

According to the electronic device of the embodiment, since the electronic device includes the wiring board 1 having the above-described configuration and the electronic part 2 mounted on the wiring board 1, the reliability of electrical connection between the electronic part 2 and the external circuit board can be improved.

Second Embodiment

Next, an electronic device according to a second embodiment of the invention will be described with reference to FIG. 6.

Figure 6:
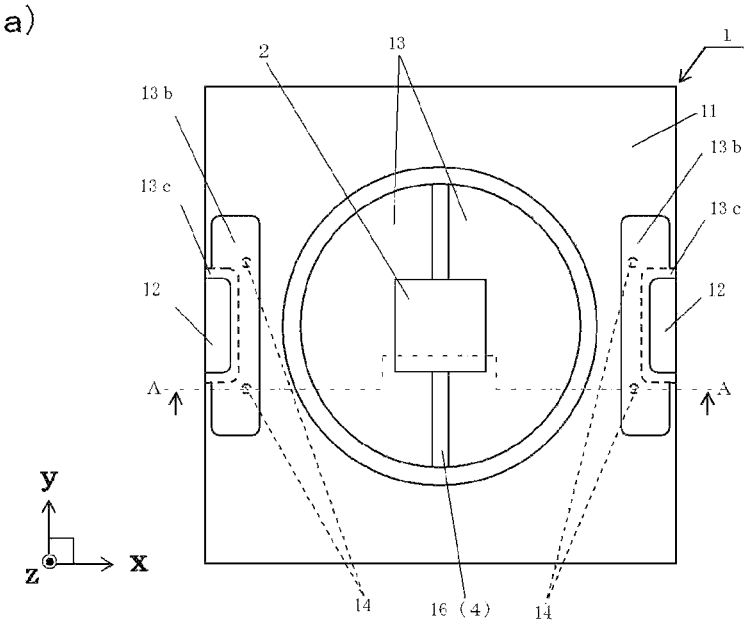
FIG. 6(a) is a see-through top view showing a wiring board according to a second embodiment of the invention.
FIG. 6(b) is a see-through cross-sectional view taken along the line A-A in FIG. 6(a)
Figure 6:
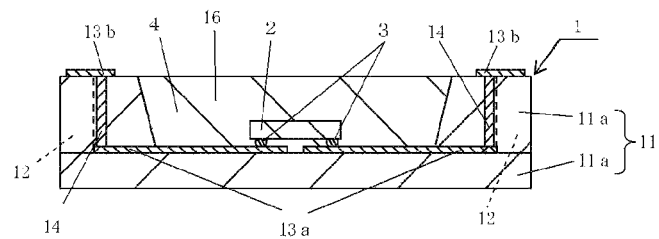
Figure 6:
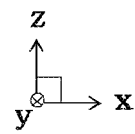

The electronic device according to the embodiment differs from the electronic device of the above-described first embodiment in that, as in the example shown in FIG. 6, the external wiring conductor 13b is led out onto the same main surface as the mounting surface of the electronic part 2 of the insulating base 11, or in other words, the upper surface of the insulating base 11. In this case, since the external wiring conductor 13b can be bonded to the external circuit board on the upper surface side of the wiring board 1, the heat dissipation property of the wiring board 1 can be improved by bonding a material having a thermal conductivity higher than that of the insulating base 11 on the entirety of the lower surface side of the wiring board 1. Examples of a material whose thermal conductivity is higher than that of the insulating base 11 include a metallic material such as copper (Cu), copper-tungsten (Cu—W), or aluminum (Al). Also, in a case where the insulating base 11 is formed of an aluminum oxide sintered body, an insulating member formed of aluminum nitride sintered body or the like can be used.

Note that the insulating base 11 may have an upper surface including a cavity 16, as in the example shown in FIG. 6. The cavity 16 can be formed by forming a through hole which is to be the cavity 16 in plural ceramic green sheets by means of laser machining, punching using a die, or otherwise, and laminating these ceramic green sheets on a ceramic green sheet without any through hole. Also, in a case where the insulating base 11 has thin thickness, it is preferable that, after laminating the ceramic green sheets, the through holes for the cavity 16 are formed by means of laser machining, punching using a die, or otherwise, and thereby machining can be performed with good accuracy.

In a case where the cavity 16 is a space for mounting a light emitting element, as in the example shown in FIG. 6, it is preferable that an angle θ formed by the inner surface of the cavity 16 and the bottom surface of the cavity 16 is obtuse, and is 110 to 145 degrees in particular. By setting the angle θ to be within this range, it is easier to stably and effectively form the inner surface of the through hole which is to be the cavity 16 in the punching step, and it is easier to reduce the size of the light emitting apparatus using the wiring board 1. Also, the light generated by the light emitting element can be emitted favorably toward the exterior. The cavity 16, which has an inner surface with the angle θ, is formed by punching the ceramic green sheet using a punching mold set such that the clearance between the punch diameter and the hole diameter of the dice is large. In other words, by setting the clearance between the punch diameter of the punching mold and the hole diameter of the dice to be large, the green sheet is subjected to shearing from the edge of the contact surface with the punch to the edge of the contact surface with the hole of dice when the ceramic green sheet is punched from a main surface side to the other main surface side, and the diameter of the through hole expands from the main surface side to the other main surface side. At this time, by setting the clearance between the punch diameter and the hole diameter of the dice according to the thickness of the ceramic green sheet and the like, the angle of the inner surface of the through hole formed in the ceramic green sheet can be adjusted. This punching method has high productivity because using only punching, the angle θ formed by the inner surface of the cavity 16 and the bottom surface of the cavity 16 can be set to a desired angle.

Also, after a through hole in which the angle θ is about 90 degrees is formed by machining using a punching mold having a small clearance between the punch diameter and the hole diameter of the dice, a through hole having an angle θ which increases from one main surface side to the other main surface side as described above may be formed by pressing a mold having a circular truncated cone or a truncated pyramid onto the inner surface of the through hole. In this case, the angle θ formed by the inner surface of the cavity 16 and the bottom surface of the cavity 16 can be adjusted with greater accuracy.

In a case where the wiring board 1 has the insulating base 11 which has an upper surface including the cavity 16 in which a light emitting element is to be mounted, for example, a reflection layer for reflecting the light emitted by the light emitting element may be disposed on the inner wall surface of the cavity 16. The reflecting layer has a metallic conductor layer disposed on the inner wall surface of the cavity 16 and a plating layer deposited on the metallic conductor layer, for example. The metallic conductor layer can be formed using the same material and method as the wiring conductor 13.

For example, in a case where a light emitting element is mounted on the wiring board 1, it is preferable that a silver plating layer is deposited on the outermost surface of the metallic conductor layer and a gold plating layer is deposited on the outermost surface of a conductor layer 13 and the wiring conductor 13. This is because the gold plating layer has superior bonding properties with the electronic part 2, the connecting member 3, and the wires of the external circuit board compared to the silver plating layer, and the silver plating layer has a high reflectance rate for light compared to the gold plating layer. Also, the outermost surfaces of the wiring conductor 13 and the metallic conductor layer may be an alloy plating layer of silver and gold, and for example, it may be an alloy plating layer of a complete solid solution of silver and gold.

Third Embodiment

Next, an electronic device according to a third embodiment of the invention will be described with reference to FIGS. 7 and 8.

Figure 7:
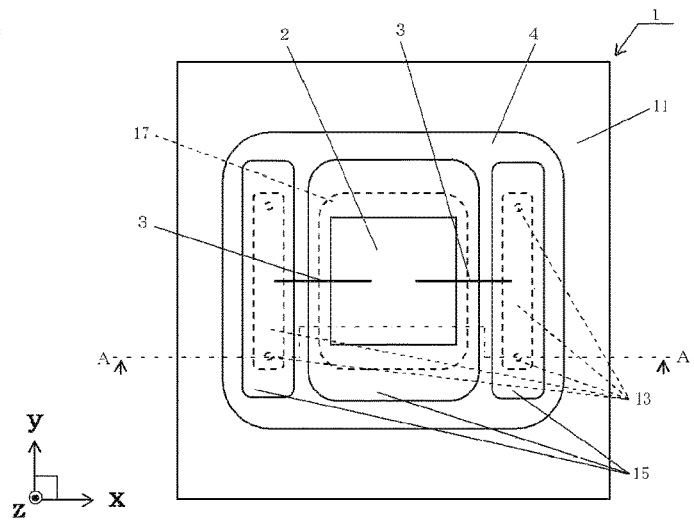
FIG. 7(a) is a see-through top view showing a wiring board according to a third embodiment of the invention.
FIG. 7(b) is a see-through bottom view of FIG. 7(a)
Figure 7:
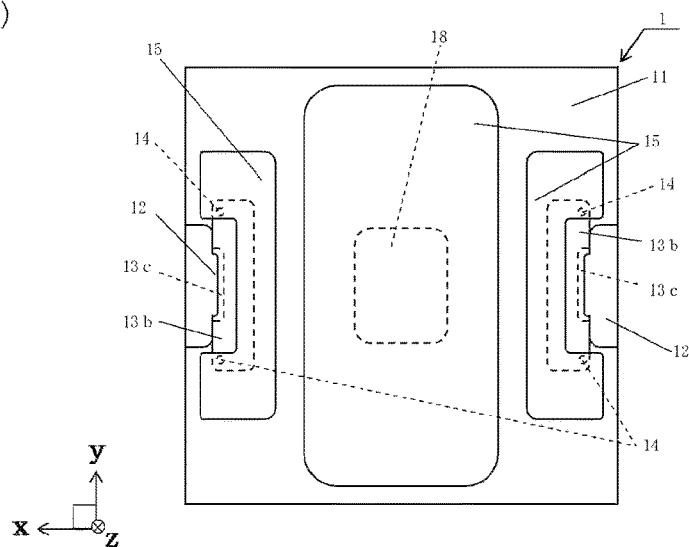
Figure 8:
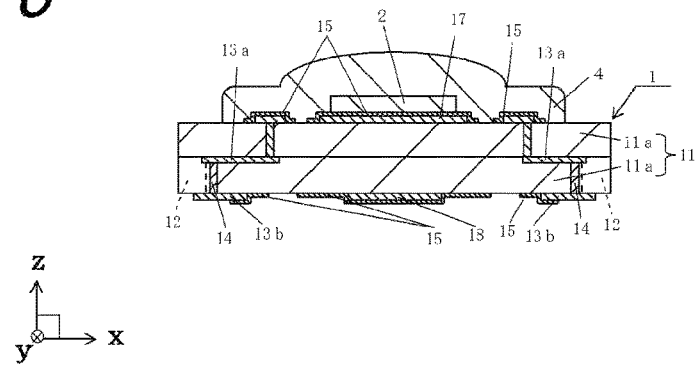
FIG. 8 is a see-through cross-sectional view taken along the line A-A in FIG. 7(a)

The electronic device according to the embodiment differs from the electronic device of the above-described first and second embodiments in that, as in the examples shown in FIGS. 7 and 8, the recessed portion wiring conductor 13c is separated from the side surface of the insulating base 11, and in that a thin film layer 15 is formed on the upper and lower surfaces of the insulating base 11 so as to overlap the wiring conductor 13. Note that in the embodiment, the recessed portion 12 has a shape formed by overlapping plural rectangles in a plan view, as in the example shown in FIG. 7.

The thin film layer 15 is disposed on the upper surface of the insulating base 11 so as to overlap the wiring conductor 13. For example, a metallic material such as tungsten (W), molybdenum (Mo), titanium (Ti), copper (Cu), or the like can be used as the material for the thin film layer 15. The thin film layer 15 is composed of plural layers which have a layer of a titanium alloy such as TiW (titanium tungsten) having a thickness of 0.01 to 0.5 μm, and a layer of Cu (copper) having a thickness of 1.0 to 100.0 μm, for example.

The thin film layer 15 is formed using conventional thin film forming methods that are widely known, such as ion plating, sputtering, or vapor deposition. For example, a metallic layer is formed on the surface of the insulating base 11 using ion plating, sputtering, vapor deposition, or otherwise. Thereafter, a resist pattern is formed using photolithography, and an excess metallic layer is removed using wet etching to form the thin film layer. Note that a plating layer is deposited on the exposed surface of the thin film layer 15 in a manner similar to that of the wiring conductor 13.

In some cases, a metallic layer is deposited over a wide range when the thin film layer 15 is to be deposited at the time of producing the thin film layer 15. Excess regions of the metallic layer are removed using etching, and thereby the wiring is formed. When performing etching, sometimes part of the wiring conductor 13 disposed on the inner surface of the recessed portion 12 is removed, resulting in the wiring conductor 13 disposed on the inner surface of the recessed portion 12 being disconnected or decreasing in thickness. Even if the recessed portion wiring conductor 13c is disconnected or decreases in thickness, the wiring board 1 of the embodiment can electrically connect the portion of the wiring conductor 13 disposed on the upper surface of the insulating layer 11a and the portion of the wiring conductor 13 disposed on the lower surface of the insulating base 11 using the through conductor 14.

Also, as in the example shown in FIG. 7, in the wiring conductor 13, plural through wiring conductors connecting both of the wiring conductor layers positioned above and below through the insulating layer 11a may be provided to match the arrangement of the plural through conductors 14.

Also, as in the examples shown in FIGS. 7 and 8, the wiring board 1 has an electronic part mounting layer 17, a central terminal 18, and the like in the embodiment. The electronic part mounting layer 17 is used for mounting the electronic part 2, for example. The central terminal 18 is used for bonding with the external circuit board, for example. The electronic part mounting layer 17 and the central terminal 18 can be produced using the same materials and methods as the wiring conductor 13 and the thin film layer 15, for example. In a case where the electronic part mounting layer 17 or the central terminal 18 is exposed, a plating layer similar to the wiring conductor 13 and the thin film layer 15 is deposited on the surface of the electronic part mounting layer 17 or the central terminal 18.

The invention is not limited to the examples described in the embodiments above, and various modifications are possible. For example, the wiring board 1 may be such that through holes are formed in the insulating base 11 and a metallic member having higher heat dissipation than the insulating base 11 is fitted into the through holes. The electronic part 2 may be mounted on the metallic member.

Also, with the wiring board 1, a metallic member having higher heat dissipation than the insulating base 11 may be embedded in the insulating base 11 and the metallic member may overlay the region at which the electronic part 2 is mounted in a see-through plan view.

Figure 9:
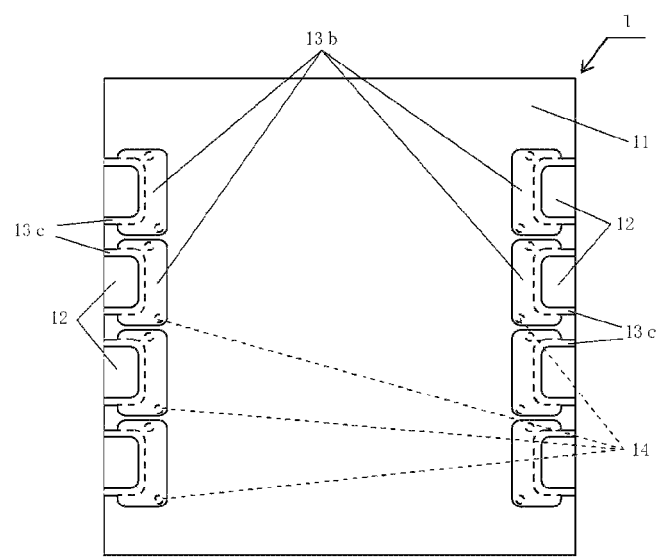
FIG. 9 is a see-through bottom view showing another example of the wiring board according to the first embodiment of the invention.
Figure 9:
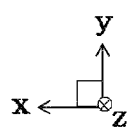

Also, as in the example shown in FIG. 9, in a case where plural recessed portions 12 are arranged adjacent to each other, their arrangement may be shifted such that the distance between the through conductors which are adjacent to each other in a see-through plan view increases.

Also, the wiring board 1 may be manufactured in a form of a segmentable wiring board.

REFERENCE SIGNS LIST

1: Wiring board
11: Insulating base
11a: Insulating layer
12: Recessed portion
12a: First internal wall surface
12aa: First extension line
12b: Second internal wall surface
12ba: Second extension line
13: Wiring conductor
13a: Internal wiring conductor
13b: External wiring conductor
13c: Recessed portion wiring conductor
14: Through conductor
15: Thin film layer
16: Cavity
17: Electronic part mounting layer
18: Central terminal layer
2: Electronic part
3: Connecting member
4: Sealing member

The invention claimed is:

1. A wiring board, comprising:
an insulating base formed of ceramics;
a recessed portion provided on a side surface of the insulating base, the recessed portion being connected to a lower surface of the insulating base;
an internal wiring conductor disposed in an interior of the insulating base;
an external wiring conductor disposed on the lower surface of the insulating base;
a recessed portion wiring conductor disposed in the recessed portion, the recessed portion wiring conductor being separated from the side surface of the insulating base and being connected to the internal wiring conductor and the external wiring conductor;
a through conductor disposed in an interior of the insulating base, the through conductor electrically connecting the internal wiring conductor and the external wiring conductor, in a see-through plan view of the insulating base from the lower surface, the recessed portion extending in one direction, the through conductor being disposed in a periphery of an end portion of the recessed portion, a thin film layer made of a metal and being disposed on the lower surface of the insulating base, in a see-through plan view of the insulating base from the lower surface, the thin film layer not overlapping the recessed portion wiring conductor but overlapping the external wiring conductor and the through conductor, the recessed portion including a first inner wall surface extending in the one direction and being convex toward the side surface of the insulating base when viewed in a see-through plan view of the insulating base from the lower surface of the insulating base.

2. The wiring board according to claim 1, wherein in a see-through plan view of the insulating base from the lower surface, the through conductor is disposed in a periphery of both ends of the recessed portion.

3. The wiring board according to claim 2, wherein in a plan view of the insulating base from the lower surface, the recessed portion comprises a second inner wall surface extending in a direction different from that of the first inner wall surface, and a corner portion at which the first inner wall surface and the second inner wall surface intersect, and the through conductor is disposed in a region in the interior of the insulating substrate which is partitioned by a first extension line obtained by extending the first inner wall surface and a second extension line obtained by extending the second inner wall surface.

4. The wiring board according to claim 1, wherein in a plan view of the insulating base from the lower surface, the recessed portion comprises a second inner wall surface extending in a direction different from that of the first inner wall surface, and a corner portion at which the first inner wall surface and the second inner wall surface intersect, and the through conductor is disposed in a region in the interior of the insulating substrate which is partitioned by a first extension line obtained by extending the first inner wall surface and a second extension line obtained by extending the second inner wall surface.

5. The wiring board according to claim 4, wherein in a see-through plan view of the insulating base from the lower surface, the through conductor has a shape extending toward the corner portion.

6. An electronic device, comprising:

the wiring board according to claim 1; and an electronic part mounted on an upper surface or a lower surface of the wiring board.

7. A light emitting apparatus, comprising:

a light emitting element as the electronic part according to claim 6.

* * * * *